(12) United States Patent
Paglieri

(10) Patent No.: US 6,988,228 B2
(45) Date of Patent: Jan. 17, 2006

(54) CONFIGURABLE SCAN PATH STRUCTURE

(75) Inventor: Alessandro Paglieri, Bussana di Sanremo (IT)

(73) Assignee: Texas Instruments Incorporated, Dallas, TX (US)

( * ) Notice: Subject to any disclaimer, the term of this patent is extended or adjusted under 35 U.S.C. 154(b) by 450 days.

(21) Appl. No.: 10/243,324

(22) Filed: Sep. 13, 2002

(65) Prior Publication Data

US 2003/0192024 A1   Oct. 9, 2003

(30) Foreign Application Priority Data

Apr. 4, 2002   (EP)   ................................ 02290839

(51) Int. Cl.
*G01R 31/28*   (2006.01)
(52) U.S. Cl. ...................................... 714/726
(58) Field of Classification Search ................ 714/724, 714/726, 727, 729, 732, 733
See application file for complete search history.

(56) References Cited

U.S. PATENT DOCUMENTS 6,125,464 A * 9/2000 Jin ............................ 714/727

* cited by examiner

*Primary Examiner*—Albert DeCady
*Assistant Examiner*—James C. Kerveros
(74) *Attorney, Agent, or Firm*—J. Dennis Moore; W. James Brady, III; Frederick J. Telecky, Jr.

(57) ABSTRACT

A test structure is for a circuit (20) includes a scan configuration module (26), including routing circuitry (28) and control (30). The routing circuitry (28), under control of control circuitry (30) can be configured to route scan test signals to various scan core modules (36) over a selected number of input scan ports SI(N−1:0) and output scan ports SO(N−1:0). Thus, the number of scan ports used can be varied depending upon the tester being used.

16 Claims, 3 Drawing Sheets

CONFIGURABLE SCAN PATH STRUCTURE

CROSS-REFERENCE TO RELATED APPLICATIONS

Not Applicable

STATEMENT OF FEDERALLY SPONSORED RESEARCH OR DEVELOPMENT

Not Applicable

Applicant claims priority from European Patent Application No. 02290839.6 filed Apr. 4, 2002.

BACKGROUND OF THE INVENTION

1. Technical Field

This invention relates in general to electronic circuits and, more particularly, to an electronic circuit with a configurable scan path.

2. Description of the Related Art

As circuit designs become denser and more complicated, the need for testing increases. Scan path testing, where test data is input to various circuit modules and the resultant output is compared to expected results, is one of the most powerful testing schemes. Unfortunately, scan path testing is one of the larger costs involved in manufacturing an electronic device.

To reduce scan path testing costs, low cost testers have been developed to reduce tester costs. Typically, however, the low cost testers are limited in function vis-à-vis more expensive testers, particularly in the number of scan chains that can be simultaneously tested at the most efficient mode of test operation for the tester.

Accordingly, the circuit designer must make a decision regarding whether to design a circuit with fewer, long scan chains for optimization of testing on a low cost tester, or a circuit with more, shorter scan chains for optimization of testing on a higher cost tester. This scenario places the designer in a difficult position, since it is most efficient to test many circuit designs on the low cost tester during the beginning stages (on die) and on the more expensive tester at later stages (packaged chip).

Therefore, a need has arisen for a circuit design that can be optimized for multiple testers.

BRIEF SUMMARY OF THE INVENTION

In the present invention, an integrated circuit includes logic circuitry having a plurality of defined logic cores. A plurality of input scan core ports and a plurality of a plurality of output scan ports are coupled to the logic cores using routing circuitry for selectively routing test signals on the input scan ports through specified logic cores, such that the number of input scan ports used to pass test signals can be programmably configured to optimize testing using various testers.

The present invention has significant advantages over the prior art. Most importantly, the invention allows optimization of scan test time to any tester being used. Thus, if different testers are used during different stages, the scan configuration can be dynamically configured for each tester. This reduces test time and hence reduces costs due to testing.

Further, if it is necessary, or desirable, to change testers over a term of production of a device, the new tester can be accommodated at its optimum configuration without redesign of the device.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The present invention is best understood in relation to FIGS. 1–5a–d of the drawings, like numerals being used for like elements of the various drawings.

Figure 1A:
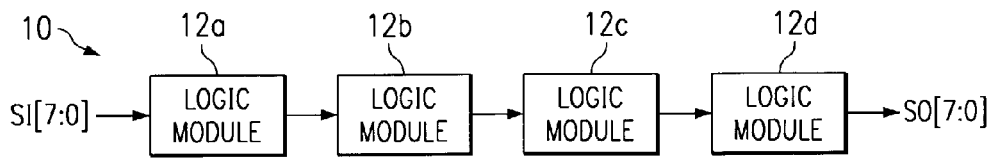
FIGS. 1a and 1b illustrate prior art scan test structures.
Figure 1B:
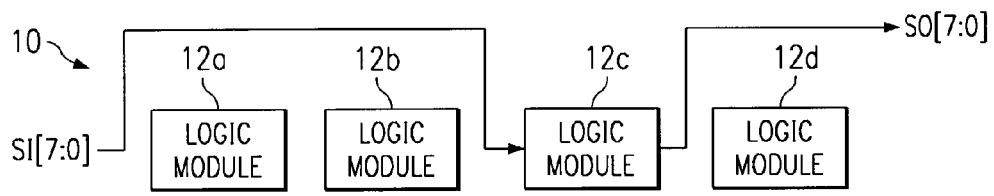

FIGS. 1a and 1b illustrate the inflexibility of scan path design in a circuit 10 when using a limited logic tester as in the prior art. In the embodiment illustrated in FIGS. 1a and 1b, it is assumed that the logic tester can test a maximum of eight scan chains in serial mode. In this embodiment, a single scan input port SI of eight scan chains [7:0] is serially passed through four logic modules 12 (referenced individually as logic modules 12a–d), resulting in a single scan output port SO[7:0].

In the embodiment of FIG. 1a, in order to test all modules 12, the data must pass serially through the modules. Accordingly, the test time is very long.

As shown in FIG. 1b, the prior art also allows testing a single module at a time. In FIG. 1b, only module 12c is tested. While this allows a faster test, for a complete test, a single module test would be required on each module, and the total test time would be even greater than that of FIG. 1a.

Figure 2:
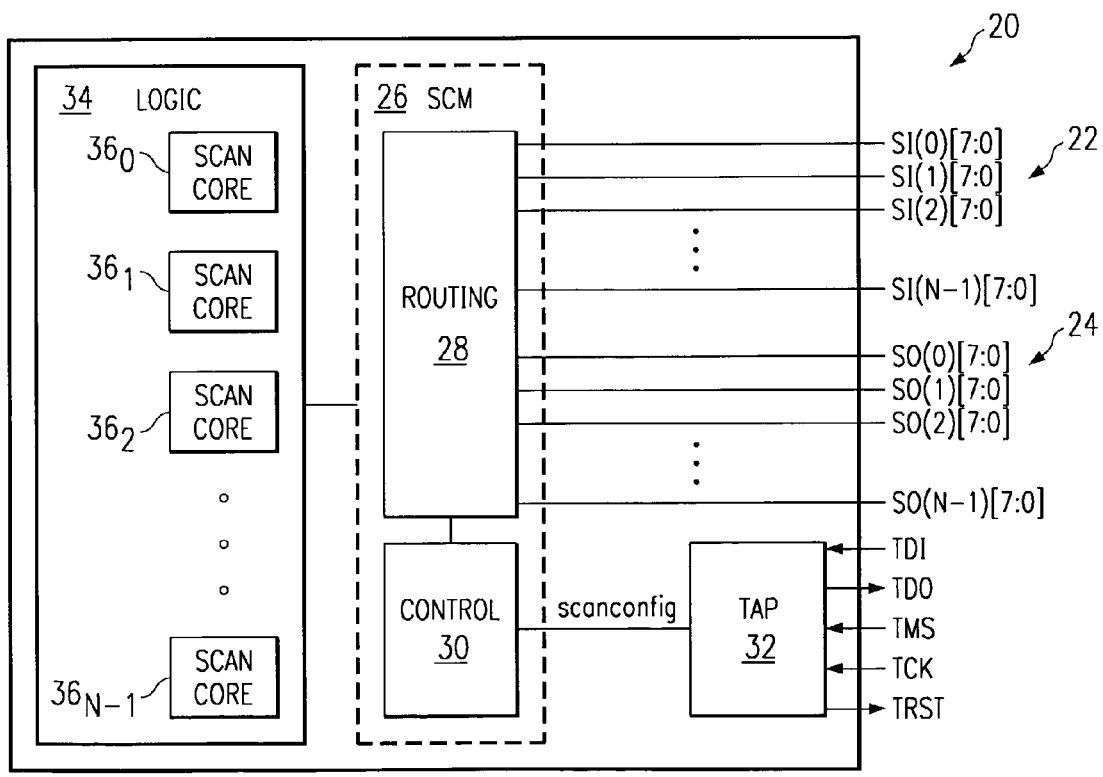
FIG. 2 illustrates a block diagram of an integrated circuit with a configurable scan test architecture for accommodating various tester scan access bus widths and more complicated scan paths.

FIG. 2 illustrates a block diagram of a circuit architecture that allows flexible routing of scan chains, such that a single circuit design can use both low-end and high-end testers efficiently.

In FIG. 2, a circuit 20 has inputs for N input scan ports 22 and N output scan ports 24. For the illustrated embodiment, each input scan port 22 and output scan port 24 has eight scan chains; however, for a given design, each scan port could accommodate any desired number of scan chains. The scan ports 22 and output scan ports 24 are coupled to a scan configuration module (SCM) 26, which includes routing circuitry 28 and control circuitry 30. Control circuitry 28 operates responsive to control word scanconfig, which is received through TAP (test access port) circuitry 32. TAP circuitry 32 includes external ports TDI (test data in), TDO (test data out), TMS (test mode select), TCK (test clock), and TRST (test reset). The TAP circuitry 32 can be used to instruct the control circuitry 30 on a desired setting for the routing circuitry 28.

The SCM is coupled to the logic 34. The logic 34 includes the various scan cores 36 (individually referenced as $36_0$ through $36_{N-1}$) that can be tested.

Figure 4:
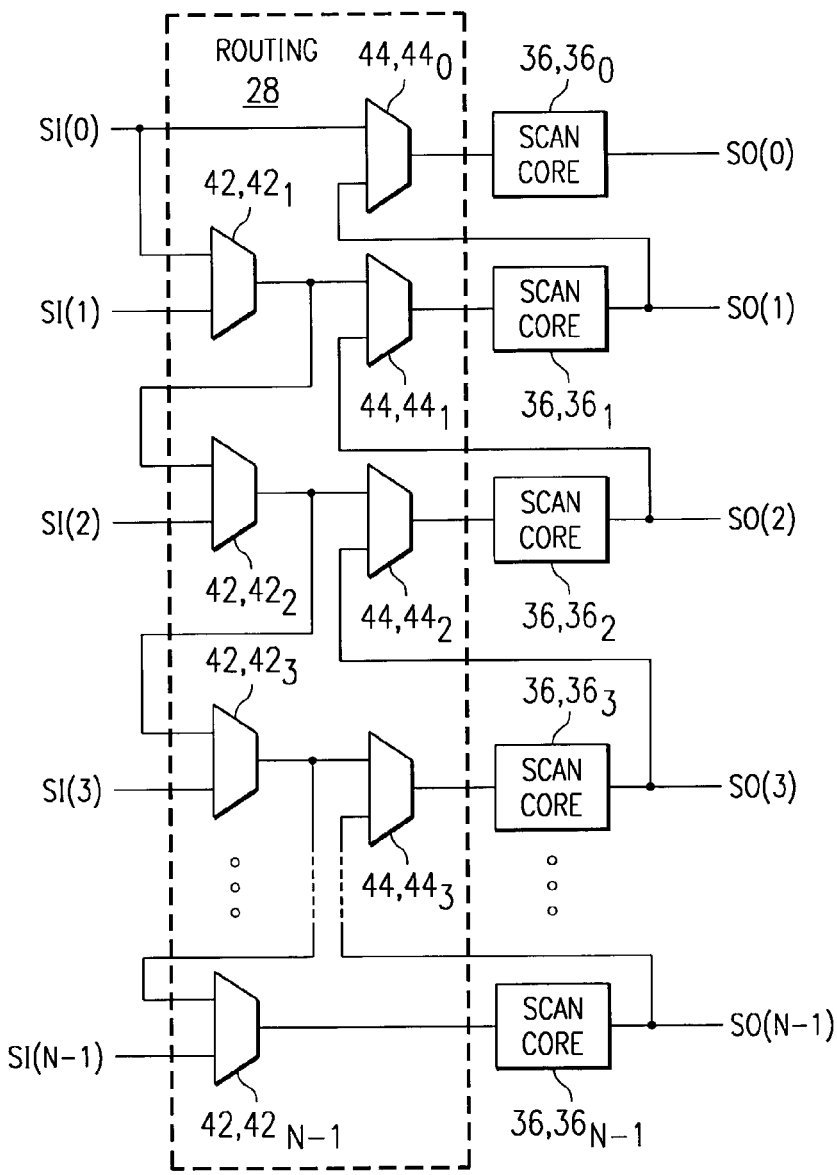
FIG. 4 illustrates a block diagram of the routing circuitry in relation to the scan cores.

In operation, the routing circuitry 28, shown in greater detail in connection with FIG. 4, serves to selectively route multiple scan ports through sequences of scan cores 36. The SCM 26 can reconfigure the structure of the scan chain paths so that the highest degree of parallelism can be achieved, based on the capabilities of the tester.

Figure 3:
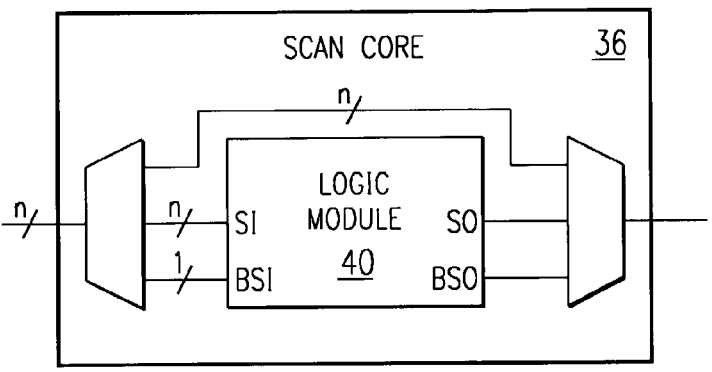
FIG. 3 illustrates a block diagram of a scan core used in the logic of FIG. 2.

FIG. 3 illustrates a block diagram of a scan core 36. Each scan core 36 includes a logic module 40. The scan core 36 has three modes of operation. In the first mode (scan mode), the logic module 40 receives data over the scan chains at its scan port SI. In the second mode (bypass mode), the logic module 40 is bypassed by the scan chains. In the third mode (boundary scan mode), data is received at a separate boundary scan input port, BSI.

In scan mode, data received via the scan chains on the scan input, SI, propagates through the logic module 40 and is output at the scan output SO. In bypass mode, the data on the scan chains is output without propagation through the logic module 40. In boundary scan mode, data received via the boundary scan input, BSI, propagates through the logic module 40 and is output from the boundary scan output, BSO.

FIG. 4 illustrates a preferred embodiment for routing scan chains through the scan cores 36 using the routing circuitry 28. A first set of multiplexers 42 (individually referenced as multiplexers $42_1$ through $42_{N-1}$) selectively pass the signal from the input scan ports SI(0) through SI(N-1) to the scan cores 36. The multiplexers 42 are arranged such that each input scan port SI(1) through SI(N-1) is coupled to the respective multiplexer $42_1$ through $42_{N-1}$. The output of each multiplexer $42_1$ through $42_{N-1}$ is coupled to the other input of the next sequential multiplexer 42; hence, the output of multiplexer $42_1$ is coupled to the input of multiplexer $42_2$ along with input scan port SI(2), the output of multiplexer $42_2$ is coupled to the input of multiplexer $42_3$ along with input scan port SI(3), the output of multiplexer $42_3$ is coupled to the input of multiplexer $42_4$ along with input scan port SI(4), and so on. The output of each multiplexer $42_1$ through $42_{N-2}$ is also coupled to the input of a respective multiplexer $44_1$ through $44_{N-2}$. Input scan port SI(0) is coupled to an input of multiplexer $44_0$. The other input to each multiplexer $44_0$ through $44_{N-2}$ is coupled to the output of the next higher scan core 36. Hence the output of scan core $36_1$ is coupled to an input of multiplexer $44_0$, the output of scan core $36_2$ is coupled to an input of multiplexer $44_1$, and so on. The output of each multiplexer $44_0$ through $44_{N-2}$ is coupled to the input of scan cores $36_0$ through $36_{N-2}$, respectively. The output of multiplexer $42_{N-1}$ is coupled to the input of scan core $36_{N-1}$.

As described above, the control circuitry 30 controls the routing circuitry 28, responsive to tester commands issued via the TAP circuitry 32. Table 1 provides a preferred embodiment for signaling to set up the routing circuitry 28 and scan cores 36. In this table, the N denotes the number of scan ports and n denotes the number of scan chains per scan port.

TABLE 1

SIGNALLING

| Name | Size | I/O | Source/Dest. | Signal description |
|---|---|---|---|---|
| chip_so | N*n | O | Chip-Level Pin | Chip-level Scan out |
| chip_soen | N*n | O | Chip-Level Pin | Chip-level Scan port multiplexing control |
| chip_si | N*n | I | Chip-Level Pin | Chip-level Scan in |
| chip_se | 1 | I | Chip-Level Pin | Chip-level Scan enable |
| scanconfig | N*3 | I | Test Control Reg | Configuration control |
| scan_mode | 1 | O | System | Indication of scan mode activation; Scan_mode is active whenever a test_en is activated. To be used at system level if needed. |
| core_se | N | O | Scan Cores | Cores Scan enable (shift mode) |
| core_te | N | O | Scan Cores | Cores Test enable (scan mode) |
| corebndry_se | N | O | Scan Cores | Cores Boundary Scan enable |
| corebndry_te | N | O | Scan Cores | Cores Boundary Test enable |
| corebndry_si | N | O | Scan Cores | Cores Boundary Scan in |
| corebndry_so | N | I | Scan Cores | Cores Boundary Scan out |
| core_si | N*n | O | Scan Cores | Cores Scan in |
| core_so | N*n | I | Scan Cores | Cores Scan out |

The SCM 26 is designed to be completely generic. There is no limitation on the number of "Scan Cores" that can be hooked-up. A "N_CORES" (equal to N) generic constant must be defined into the package section of RTL code to indicate the number of cores. Also a "N_CHAINS" (equal to n) constant indicating the Scan Core number of chains must be defined. The SCM 26 is controlled by the scanconfig control signal. As shown in Table 2, scanconfig is divided into three fields, each field being N_CORES bits wide:

TABLE 2

| Scanconfig |
|---|
| Scanconfig [(N_CORES-1)*3:0] |

| Cores_te[N_CORES-1:0] | Cores_bndryte[N_CORES-1:0] | Scan_pads_en[N_CORES-1:0] |
|---|---|---|

In operation, the signal on an input scan port SI(x) can propagate through the multiplexers 42 to any scan core $36_y$, where y≧x. The signal on the input scan port SI(x) can then pass through a chain of scan cores $36_y$ through $36_z$ via multiplexers 44, where y≧x≧z, bypassing selected scan cores 36. In this case, z denotes the last scan core 36 that does not receive signals from another scan port. For example, if SI(3) is coupled to scan core $36_3$ and SI(4) propagates through multiplexers 42 to scan core $36_7$, then the test signals on SI(4) could pass through scan cores $36_7$ through $36_4$.

The Cores_te and Cores_bndryte fields set the mode of operation for each scan core 36—i.e., bypass, internal scan chain or boundary scan chain. Each scan core 36 has an associated bit in each of the Cores_te and Cores_bndryte fields. For a given scan core 36, if the respective bits of the Cores_te and Cores_bndryte fields are both "0", then bypass mode is used for that scan core. If the respective bit in Cores_te is a "1" and the respective bit in Cores_bndryte is a "0", an internal scan chain is set. If the respective bit in Cores_te is a "0" and the respective bit in Cores_bndryte is a "1", a boundary scan chain is set.

TABLE 3

Cores_te and Cores_boundryte

| Cores_te(i) | Core_bndryte(i) | Configuration |
|---|---|---|
| 0 | 0 | Bypass |
| 1 | 0 | Internal scan chain |
| 0 | 1 | Boundary scan chain |
| 1 | 1 | Not supported (bypass) |

The remaining field of scanconfig is the Scan_pads_en field. By setting a bit in the Scan_pads_en field respective Scan Port is activated. These are also used to code different configurations.

Table 4 provides examples of different configurations that can be enabled using the invention. This is a non-exhaustive list of possible scan configurations possible using the definitions of Cores_te, Cores_boundryte, and Scan_pads_en set forth above.

TABLE 4

Configurations

| Cores_te[7:0] | Cores_bndryte[7:0] | Cores_pads_en[7:0] | Configuration |
|---|---|---|---|
| 00000000 | 00000000 | 00000000 | No scan (all chip scan_so tied low) |
| 00000001 | 00000000 | 00000001 | Core[0][7:0] on Port[0][7:0] |
| 00000010 | 00000000 | 00000001 | Core[1] on Port[0] |
| ... | ... | ... | ... |
| 10000000 | 00000000 | 00000001 | Core[7] on Port[0] |
| ..1.. | 00000000 | ..1.. | Core[i] on Port[j]; i ≧ j |
| 11111111 | 00000000 | 00000001 | Cores[7:0] on Port[0]: Full serial scan (see FIG. 1a) |
| 11111111 | 00000000 | 11111111 | Full parallel scan (each module tested in parallel) |
| 11111100 | 00000011 | 00000001 | Cores[7:2] and Cores_bndry[1:0] on Port[0]: Mixed serial scan with boundary scan |
| 11111100 | 00000011 | 11111111 | Cores[7:2] on Ports[7:2] Cores_bndry[1:0] on Ports[1:0][0]: Mixed parallel scan with boundary scan |
| 11111111 | 00000000 | 00010001 | Cores[7:4] on Port[4] Cores[3:0] on Port[0] Mixed Serial/Parallel |
| 11111111 | 00000000 | 01010101 | Core[7:6] on Port[6]; Core[5:4] on Port[4]; Core[3:2] on Port[2]; Core[1:0] on Port[0]: Mixed Serial/Parallel |

Figure 5A:
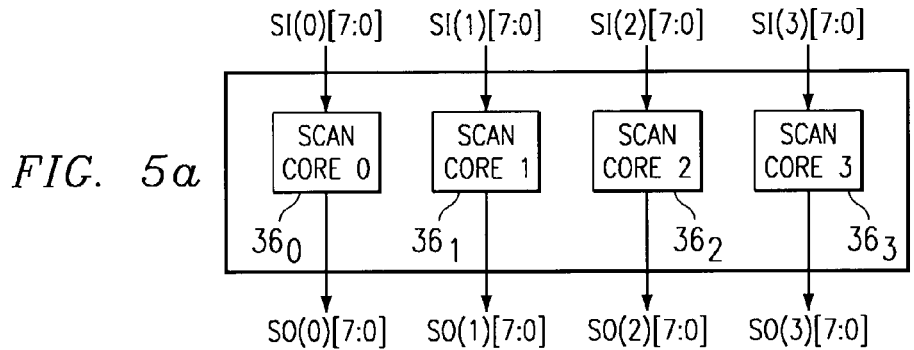
FIG. 5a through FIG. 5d illustrates various scan paths that may be implemented using the architecture of FIG. 2.
Figure 5B:
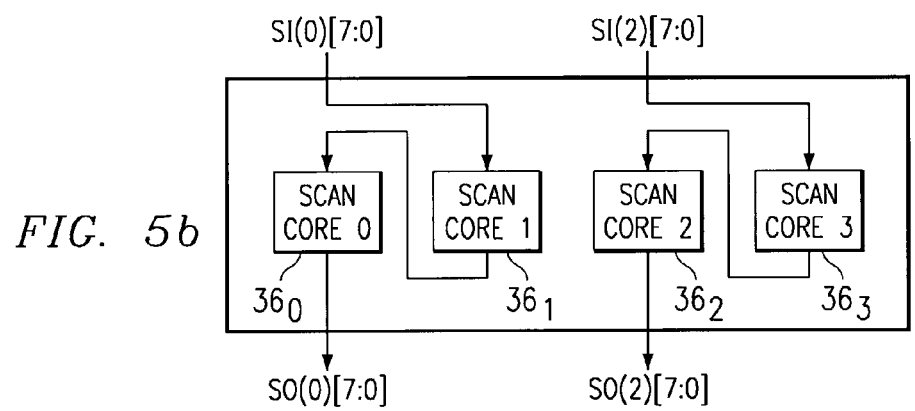
Figure 5C:
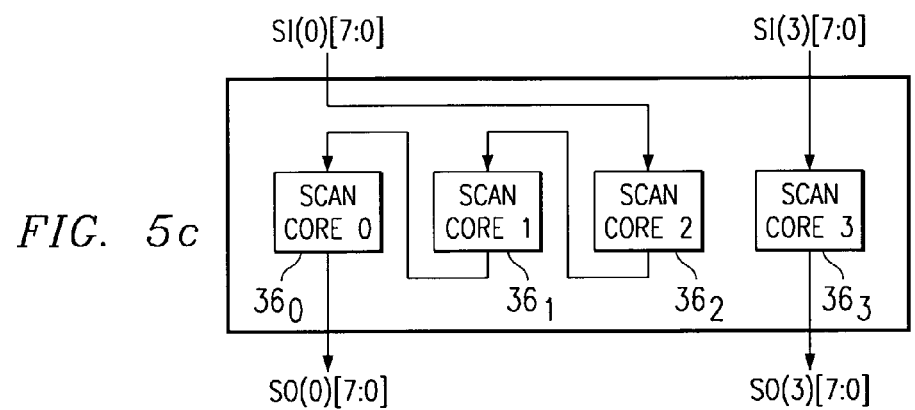

FIGS. 5a through 5c illustrate examples of different scan test structures that may be programmably implemented on a device using the invention. During on die testing, a scan test similar to that shown in FIG. 1a could be used in conjunction with low-cost (limited scan port) tester. With an N_CORES of four, such a test could be implemented using Cores_te[3:0]=1111, Cores_bndryte[3:0]=0000 and Cores_pads_en[3:0]=0001.

For high speed testing of the scan cores, which may be performed, for example, on the packaged devices with a high speed tester, a parallel test of each scan core could be used, as is shown in FIG. 5a. In this case, each scan core 36 is tested separately. With an N_CORES of four, such a test could be implemented using Cores_te[3:0]=1111, Cores_bndryte[3:0]=0000 and Cores_pads_en[3:0]=1111.

A higher speed (relative to the test of FIG. 1a), yet less parallel, test is shown in FIG. 5b. In this case, scan cores $36_0$ and $36_1$ are tested in parallel with scan cores $36_2$ and $36_3$. Such a test could be implemented using Cores_te[3:0]= 1111, Cores_bndryte[3:0]=0000 and Cores_pads_en[3:0] =0101.

In FIG. 5c, a group of three scan cores $36_0$, $36_1$, and $36_2$, are tested in parallel with a single scan core 36. Such a test could be implemented using Cores_te[3:0]=1111, Cores_bndryte[3:0]=0000 and Cores_pads_en[3:0]=1001.

Figure 5D:
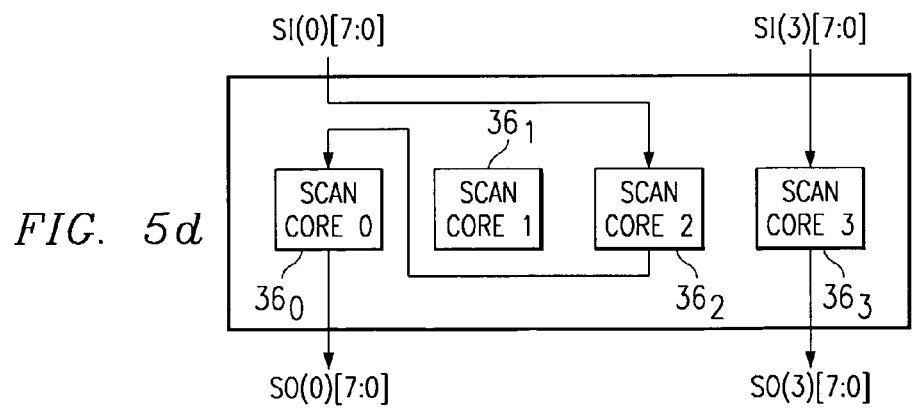

In FIG. 5d, scan cores $36_0$ and $36_2$ (with scan core $36_2$ bypassed) are tested in parallel with scan core $36_3$. This test could be implemented using Cores_te[3:0]=1011, Cores_bndryte[3:0]=0000 and Cores_pads_en[3:0] =1001.

It should be noted that an almost unlimited variety of scan test structures could be implemented using the present invention; FIGS. 5a–d illustrate only of few of these structures.

The present invention has significant advantages over the prior art. Most importantly, the invention allows optimization of scan test time to any tester being used. Thus, if different testers are used during different stages, the scan configuration can be dynamically configured for each tester. This reduces test time and hence reduces costs due to testing.

Further, if it is necessary, or desirable, to change testers over a term of production of a device, the new tester can be accommodated at its optimum configuration without redesign of the device.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the claims.

What is claimed is:

1. An integrated circuit comprising:
    logic circuitry having a plurality of defined logic cores;
    a plurality of input scan ports;
    a plurality of output scan ports; and
    routing circuitry for selectively routing test signals on said input scan ports through specified logic cores, such that the number of input scan ports used to pass test signals can programmably configured to optimize testing using various testers, wherein said routing circuitry comprises circuitry for coupling one or more of said input scan ports to any of a plurality of logic cores, and wherein said circuitry for coupling comprises a series of multiplexers each having a first input coupled to a respective input scan port and second input coupled to the output of another multiplexer.

2. The integrated circuit of claim 1 wherein said outputs of said multiplexers are also coupled to respective logic cores.

3. The integrated circuit of claim 2 and further comprising circuitry for selectively coupling one of said logic cores to either the output of a respective multiplexer or to the output of another logic core.

4. The integrated circuit of claim 1 wherein said logic cores include:
    logic circuitry; and
    circuitry for selectively coupling a test signal at an input of the logic core to said logic.

5. The integrated circuit of claim 4 wherein said circuitry for selectively coupling can bypass said test signal to an output of the logic core.

6. The integrated circuit of claim 1 and further comprising control circuitry for controlling said routing circuitry.

7. The integrated circuit of claim 6 and further comprising circuitry for receiving control information on a desired test configuration and passing said control information to said control circuitry.

8. The integrated circuit of claim 7 wherein said receiving circuitry comprises a test access port.

9. A method of testing in an integrated circuit, comprising the steps of:
    selectively enabling one or more of a plurality of input scan ports for receiving respective test signals;
    routing test signals on the selected input scan ports through specified logic cores, such that the number of input scan ports used to pass test signals can be programmably configured to optimize testing using various testers, wherein said routing step comprises the step of coupling one or more of said input scan ports to any of a plurality of logic cores, and
    wherein said step of coupling comprises controlling a series of multiplexers each having a first input coupled to a respective input scan port and second input coupled to the output of another multiplexer.

10. The method of claim 9 wherein said controlling step comprises the step controlling a series of multiplexers each having a first input coupled to a respective input scan port, a second input coupled to the output of another multiplexer and an output coupled to a respective logic core.

11. The method of claim 10 and further comprising the step of selectively coupling inputs to said logic cores to either the output of a respective multiplexer or to the output of another logic core.

12. The method of claim 9 and further comprising the step of selectively coupling a test signal at an input of a logic core to logic circuitry.

13. The method of claim 12 wherein said step of selectively coupling includes the step of selectively bypassing said test signal to an output of the logic core.

14. The method of claim 9 wherein said routing step comprises the step of routing test signals on the selected input scan ports through specified logic cores responsive to an output of a control circuit.

15. The method of claim 9 and further comprising the step of receiving control information on a desired test configuration and passing said control information to said control circuitry.

16. The method of claim 15 wherein said receiving step comprises receiving configuration information from a test access port.

* * * * *